(12) United States Patent
Kim

(10) Patent No.: US 8,071,417 B2
(45) Date of Patent: Dec. 6, 2011

(54) IMAGE SENSOR AND FABRICATION METHOD THEREOF

(75) Inventor: Tae Gyu Kim, Masan-Si (KR)

(73) Assignee: Dongbu Hitek Co., Ltd., Seoul (KR)

( * ) Notice: Subject to any disclaimer, the term of this patent is extended or adjusted under 35 U.S.C. 154(b) by 231 days.

(21) Appl. No.: 12/507,114

(22) Filed: Jul. 22, 2009

(65) Prior Publication Data

US 2010/0026863 A1 Feb. 4, 2010

(30) Foreign Application Priority Data

Jul. 29, 2008 (KR) .................. 10-2008-0074148

(51) Int. Cl.
*H01L 21/00* (2006.01)

(52) U.S. Cl. .... 438/73; 257/222; 257/292; 257/E31.079

(58) Field of Classification Search .................. 257/222, 257/292, 294, E37.133, E31.079; 438/73
See application file for complete search history.

(56) References Cited

U.S. PATENT DOCUMENTS

| | | | |
|---|---|---|---|
| 6,762,401 B2 * | 7/2004 | Lee | 250/208.1 |
| 6,902,946 B2 | 6/2005 | Theil | |
| 7,276,749 B2 * | 10/2007 | Martin et al. | 257/292 |
| 7,884,401 B2 * | 2/2011 | Shim | 257/292 |

FOREIGN PATENT DOCUMENTS

| | | |
|---|---|---|
| KR | 10-2004-0003955 A | 1/2004 |
| KR | 10-2007-0000578 A | 1/2007 |

* cited by examiner

*Primary Examiner* — N Drew Richards
*Assistant Examiner* — Yu-Hsi D Sun
(74) *Attorney, Agent, or Firm* — Saliwanchik, Lloyd & Eisenschenk

(57) ABSTRACT

An image sensor is provided. The image sensor comprises a semiconductor substrate, a dielectric interlayer, an interconnection, an image sensing unit, a via hole piercing the image sensing unit and the dielectric layer, and a bottom electrode. The semiconductor substrate includes a readout circuit. The dielectric interlayer is disposed on the semiconductor substrate. The interconnection is disposed in the dielectric interlayer and connected electrically to the readout circuit. The image sensing unit is disposed on the dielectric interlayer and includes a stack of a first impurity region and a second impurity region. The via hole pierces the image sensing unit and the dielectric interlayer to expose the interconnection. The bottom electrode is disposed in the via hole to electrically connect the interconnection and the first impurity region of the image sensing unit.

10 Claims, 5 Drawing Sheets

IMAGE SENSOR AND FABRICATION METHOD THEREOF

CROSS-REFERENCE TO RELATED APPLICATION

This application claims the benefit under 35 U.S.C. §119 to Korean Patent Application No. 10-2008-0074148, filed Jul. 29, 2008, which is hereby incorporated by reference in its entirety.

BACKGROUND

The present disclosure relates to an image sensor and a fabrication method thereof.

Image sensors are semiconductor devices that convert an optical image into an electrical signal. The image sensors are generally classified into a charge-coupled device (CCD) image sensor and a complementary metal-oxide-semiconductor (CMOS) image sensor.

The CMOS image sensor typically includes a photodiode region converting a received optical signal into an electrical signal, and a transistor region processing the electrical signal, wherein the photodiode region and the transistor region are disposed horizontally.

In such a horizontal image sensor, a photodiode region and a transistor region are disposed horizontally on a semiconductor substrate. Therefore, the horizontal image sensor has a limitation in expanding an optical sensing region in a limited area, which is generally referred to as a fill factor.

BRIEF SUMMARY

Embodiments provide an image sensor and a fabrication method thereof, which can implement the vertical integration of a photodiode and a transistor circuit.

In one embodiment, an image sensor comprises: a semiconductor substrate including a readout circuit; a dielectric interlayer disposed on the semiconductor substrate; an interconnection disposed in the dielectric interlayer and connected electrically to the readout circuit; an image sensing unit disposed on the dielectric interlayer and including a stack of a first impurity region and a second impurity region; a via hole piercing the image sensing unit and the dielectric interlayer to expose the interconnection; and a bottom electrode disposed in the via hole to connect the interconnection and the first impurity region of the image sensing unit.

In another embodiment, a method for fabricating an image sensor comprises: forming a readout circuit in a semiconductor substrate; forming an interconnection connected to the readout circuit on the semiconductor substrate; forming a dielectric interlayer on the semiconductor substrate to cover the interconnection; forming an image sensing unit including a stack of a first impurity region and a second impurity region on the dielectric interlayer; forming a via hole piercing the image sensing unit and the dielectric interlayer to expose the interconnection; and forming a bottom electrode in the via hole to electrically connect the interconnection and the first impurity region of the image sensing unit.

The details of one or more embodiments are set forth in the accompanying drawings and the description below. Other features will be apparent from the description and drawings, and from the claims.

DETAILED DESCRIPTION

An image sensor and a fabrication method thereof according to embodiments of the present invention will be described in detail with reference to the accompanying drawings.

Embodiments are not limited to a CMOS image sensor, but are applicable to any image sensor (e.g., a CCD image sensor) that requires a photodiode.

Figure 10:
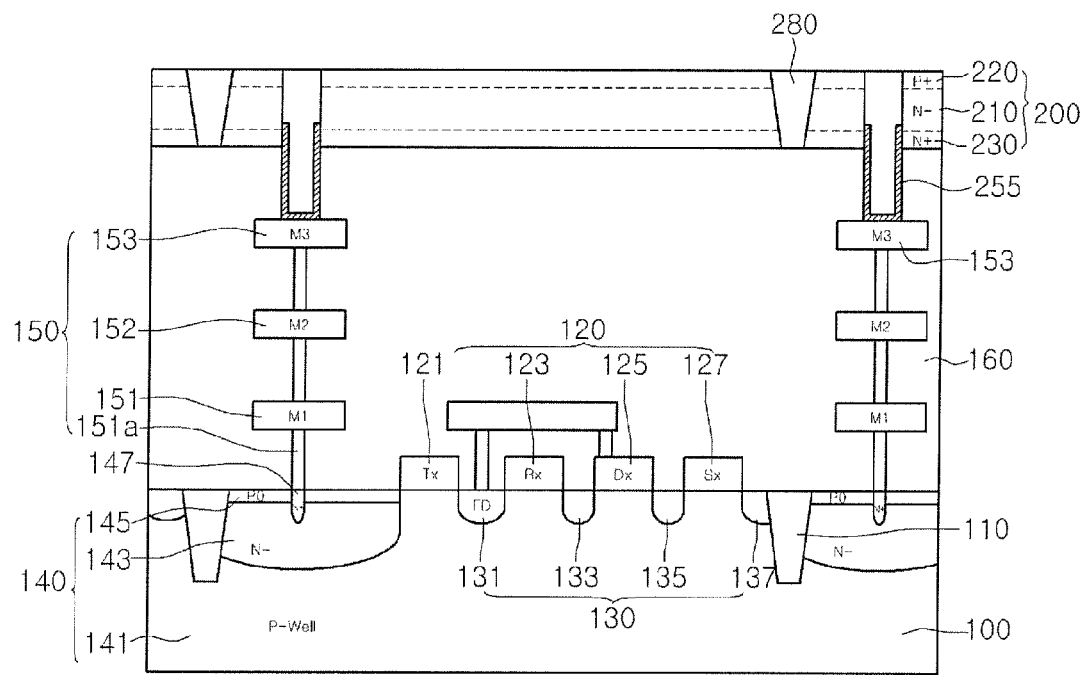

FIG. 10 is a cross-sectional view of an image sensor according to an embodiment.

Referring to FIG. 10, an image sensor according to an embodiment includes: a semiconductor substrate 100 including a readout circuit 120; a dielectric interlayer 160 disposed on the semiconductor substrate 100; a metal interconnection 150 disposed in the dielectric interlayer 160 and connected electrically to the readout circuit 120; an image sensing unit 200 disposed on the dielectric interlayer 160 and including a stack of a first impurity region 210 and a second impurity region 220; a via hole 245 (see FIG. 3) piercing the image sensing unit 200 and the dielectric interlayer 160 to expose the metal interconnection 150; and a bottom electrode 255 disposed in the via hole 245 to connect the metal interconnection 150 and the first impurity region 210 of the image sensing unit 200.

The bottom electrode 255 may be formed at the bottom and sides of the via hole 245 such that the bottom electrode 255 is connected only to the first impurity region 210. That is, the bottom electrode 255 is electrically connected only to the first impurity region 210, and is electrically disconnected from the second impurity region 220. Thus, electrons generated in the image sensing unit 200 can be transferred through the bottom electrode 255 to the readout circuit 120.

In a further embodiment, a first ion implantation region 230 is disposed under the first impurity region 210 of the image sensing unit 200. Accordingly, the bottom electrode 255 may be formed at the bottom and portions of the sides of the via hole 245 to connect the metal interconnection 150 and the first ion implantation region 230.

The undescribed reference symbols of FIG. 10 will be described in the following fabrication method.

Hereinafter, a method for fabricating an image sensor according to an embodiment will be described with reference to FIGS. 1 to 10.

Figure 1:
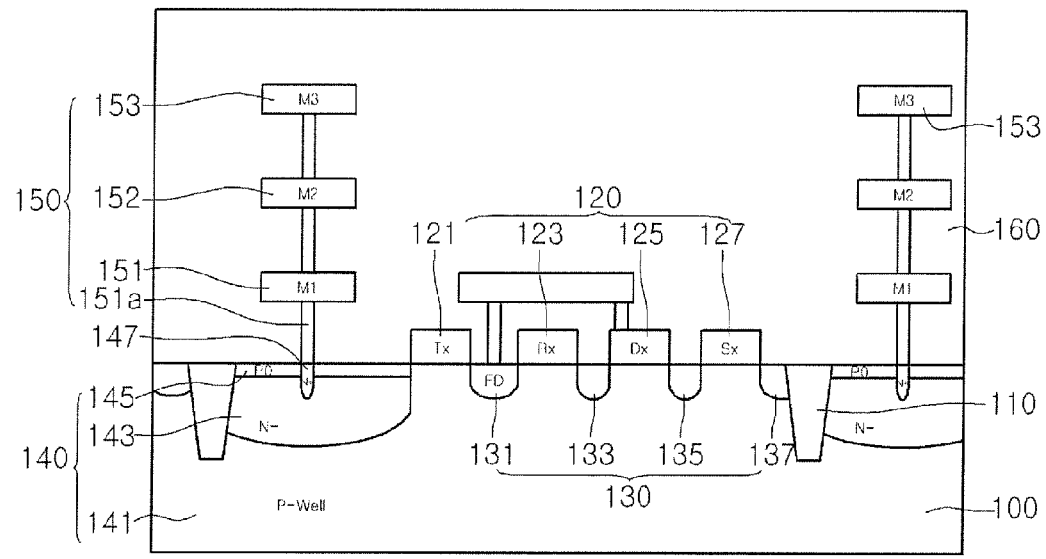
FIGS. 1 to 10 are cross-sectional views showing a process for fabricating an image sensor according to an embodiment.

Referring to FIG. 1, a readout circuit 120 is formed on a semiconductor substrate 100, and a metal interconnection 150 and a dielectric interlayer 160 are formed on the semiconductor substrate 100 including the readout circuit 120.

For example, a device isolation layer 110 is formed in a second conductivity type semiconductor substrate 100 to define an active region, and a readout circuit 120 including transistors is formed in the active region. For example, the readout circuit 120 may be formed to include a transfer transistor (Tx) 121, a reset transistor (Rx) 123, a drive transistor (Dx) 125, and a select transistor (Sx) 127. In addition, an ion implantation region 130 including a floating diffusion region (FD) 131 and source/drain regions 133, 135 and 137 for the respective transistors may be formed.

The forming of the readout circuit 120 in the semiconductor substrate 100 can further include: forming an electrical junction region 140 in the semiconductor substrate 100; and forming a first conductivity type connection region 147, which is connected to the metal interconnection 150, on the electrical junction region 140.

For example, the electrical junction region 140 may be a PN junction. However, embodiments of the present invention are not limited thereto. According to an embodiment, the electrical junction region 140 may include: a first conductivity type ion implantation layer 143 formed on a second conductivity type well 141 or a second conductivity type epitaxial layer; and a second conductivity type ion implantation layer 145 formed on the first conductivity type ion implantation layer 143. For example, the PN junction 140 may be a P0 (145)/N− (143)/P− (141) junction, to which the present invention is not limited. The semiconductor substrate 100 may be a second conductivity type, to which the present invention is not limited.

According to an embodiment, the device is designed to provide a potential difference between the source and drain of the transfer transistor (Tx), thus implementing the full dumping of a photo charge. Accordingly, a photo charge generated in the photodiode is dumped to the floating diffusion region, thereby increasing the output image sensitivity.

That is, the embodiment forms the electrical junction region 140 in the semiconductor substrate 100 including the readout circuit 120 to provide a potential difference between the source and drain of the transfer transistor (Tx) 121, thereby implementing the full dumping of a photo charge.

Hereinafter, the dumping of a photo charge according to an embodiment will be described in detail.

In an embodiment, unlike the floating diffusion (FD) 131 node of an N+ junction, the P/N/P junction 140 of the electrical junction region 140 is pinched off at a predetermined voltage without an applied voltage being fully transferred thereto. This voltage is called a pinning voltage. The pinning voltage depends on the P0 (145) and N− (143) doping concentration.

Specifically, electrons generated in a photodiode 200 are transferred to the PNP junction 140, and they are transferred to the FD (131) node to be converted into a voltage when the transfer transistor (Tx) 121 is turned on.

Since a maximum voltage value of the P0/N−/P− junction 140 becomes the pinning voltage, and a maximum voltage value of the FD 131 node becomes Vdd minus the threshold voltage (Vth) of the reset transistor (Rx), the electrons generated in the photodiode on a chip can be fully transferred into the FD 131 node without charge sharing due to a potential difference between source and drain of the transfer transistor (Tx) 131.

That is, in the embodiment, instead of an N+/P-well junction, a P0/N−/P-well junction is formed in the semiconductor substrate 100. The reason for this is that, in a 4-Tr APS (four transistor active pixel sensor) reset operation, a positive (+) voltage is applied to the N− (143) in the P0/N−/P-well junction and a ground voltage is applied to the P0 (145) and the P-well (141) and thus a P0/N−/P-well double junction generates a pinch-off at a predetermined voltage or higher, similarly to a BJT structure. This is called a pinning voltage. Therefore, a potential difference occurs between the source and drain of the Tx 121, making it possible to inhibit a charge sharing phenomenon in a Tx on/off operation.

Thus, unlike the related art case of connecting a photodiode simply to an N+ junction, this embodiment makes it possible to inhibit saturation reduction and sensitivity degradation.

After forming the junction region 140, a first conductivity type connection region 147 is formed between the photodiode and the readout circuit to create a smooth transfer path of a photo charge, thereby making it possible to further minimize a dark current source and inhibit saturation reduction and sensitivity degradation.

To this end, one embodiment may form a first conductivity type connection region 147 for an ohmic contact on the surface of the P0/N−/P− junction 140. The N+ region 147 may be formed such that it pierces the P0 (145) to contact the N− (143).

Meanwhile, the width of the first conductivity type connection 147 may be minimized to inhibit the first conductivity type connection 147 from becoming a leakage source.

To this end, a plug implant can be performed after etching a via for a first metal contact 151a. However, embodiments are not limited thereto. For example, an ion implantation pattern (not shown) may be formed, and then used as an ion implantation mask to form the first conductivity type connection region 147.

That is, a reason for the local N+ doping of only a contact formation region is to minimize a dark signal and implement a smooth formation of an ohmic contact. If the entire Tx source region is N+ doped like the related art, a dark signal may increase due to an Si surface dangling bond.

Thereafter, the metal interconnection 150 and the dielectric interlayer 160 may be formed on the first substrate 100. The metal interconnection 150 may include a first metal contact 151a, a first metal (M1) 151, a second metal (M2) 152, and a third metal (M3) 153, to which the present invention is not limited. After formation of the third metal 153, a dielectric layer may be formed to cover the third metal 153 and a planarization process may be performed to form the dielectric interlayer 160. Of course, embodiments are not limited to this particular number of metal layers. Further, the metal interconnection 150 is formed in the dielectric interlayer 160 such that the metal interconnection 150 is not exposed. Thus, the surface of the dielectric interlayer 160 having a uniform surface profile is exposed on the semiconductor substrate 100.

Figure 2:
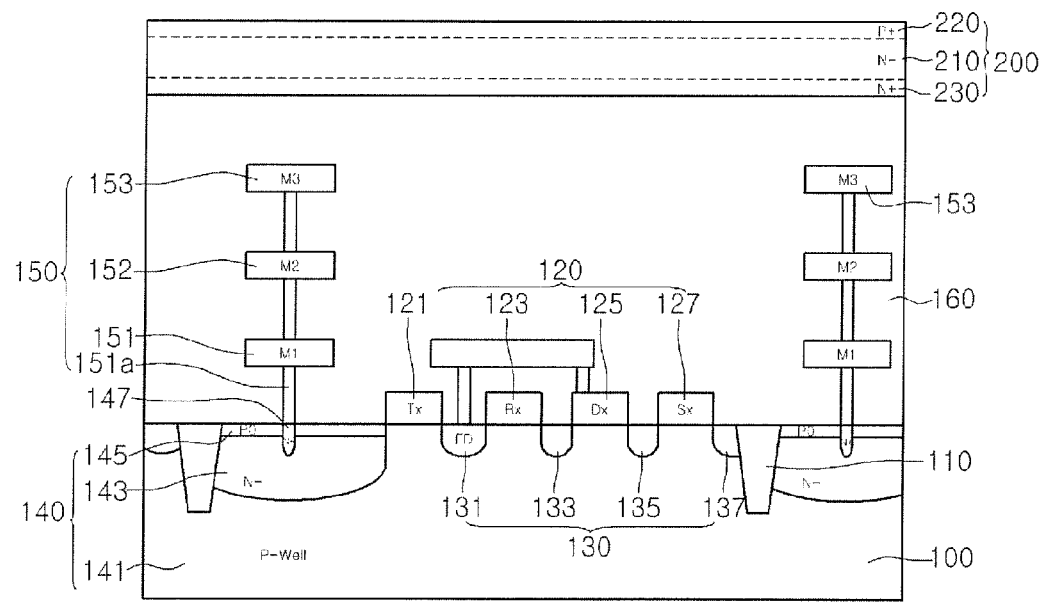

Referring to FIG. 2, an image sensing unit 200 is formed on the dielectric interlayer 160 of the semiconductor substrate 100. The image sensing unit 200 may include a first impurity region 210 and a second impurity region 220 such that is has a PN junction photodiode structure. Also, a first ion implantation region 230 may be disposed under the first impurity region 210. The first ion implantation region 230 may serve as an ohmic contact.

For example, the first impurity region 210 and the second impurity region 220 of the image sensing unit 200 may be formed by ion-implanting N-type impurities (N−) and P-type impurities (P+) into a crystalline P-type carrier substrate (not shown). In addition, high-concentration N-type impurities (N+) may be ion-implanted into a surface of the N-type impurity region to form a first ion implantation region 230.

Thereafter, after disposing the first ion implantation region 230 of the carrier substrate on the dielectric interlayer 160, a bonding process is performed to couple the semiconductor substrate 100 and the carrier substrate. Thereafter, the carrier substrate is removed to expose the image sensing unit 200 bonded to the dielectric interlayer 160.

As described above, a thee-dimensional image sensor having the image sensing unit 200 disposed over the readout circuit 120 is provided, thus making it possible to increase a fill factor and inhibit a defect in the image sensing unit 200. Also, the image sensing unit 200 having a uniform surface profile is coupled to the surface of the dielectric interlayer 160 having a uniform surface profile, thus making it possible to increase the bonding force.

The so-formed image sensing unit 200 must be electrically connected to the metal interconnection 150 connected to the readout circuit 120. Hereinafter, a process for connecting the image sensing unit 200 and the metal interconnection 150 will be described in detail.

Figure 3:
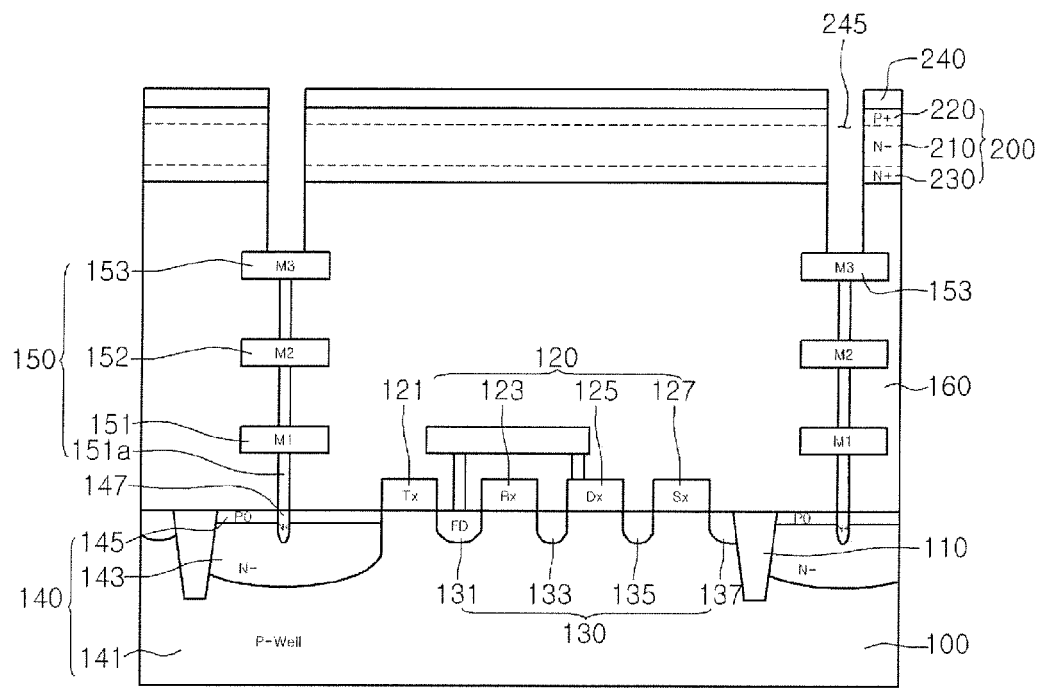

Referring to FIG. 3, a first hard mask 240 is formed on the image sensing unit 200. The first hard mask 240 may be formed to expose the surface of the image sensing unit 200 corresponding to locations above the third metal 153. In an embodiment the first hard mask 240 may be formed of an oxide or a nitride. In one embodiment, the first hard mask 240 is formed of an oxide. The first hard mask 240 can be formed of a different material than the dielectric interlayer 160. For example, where the dielectric interlayer 160 includes an oxide, the oxide of the first hard mask 240 is different from the oxide of the dielectric interlayer 160. As a specific example, the first hard mask 240 can be formed of an oxide such as $SiO_2$ and the dielectric interlayer 160 can include BPSG.

Using the first hard mask 240 as an etch mask, the image sensing unit 200 and the dielectric interlayer 160 are etched to form a via hole 245 exposing the third metal 153. For example, the image sensing unit 200 may have a height of about 1.5 μm to about 1.7 μm, and the via hole 245 may have a diameter of about 25 nm to about 40 nm. That is, the via hole 245 may be a deep via hole with a high aspect ratio.

Figure 4:
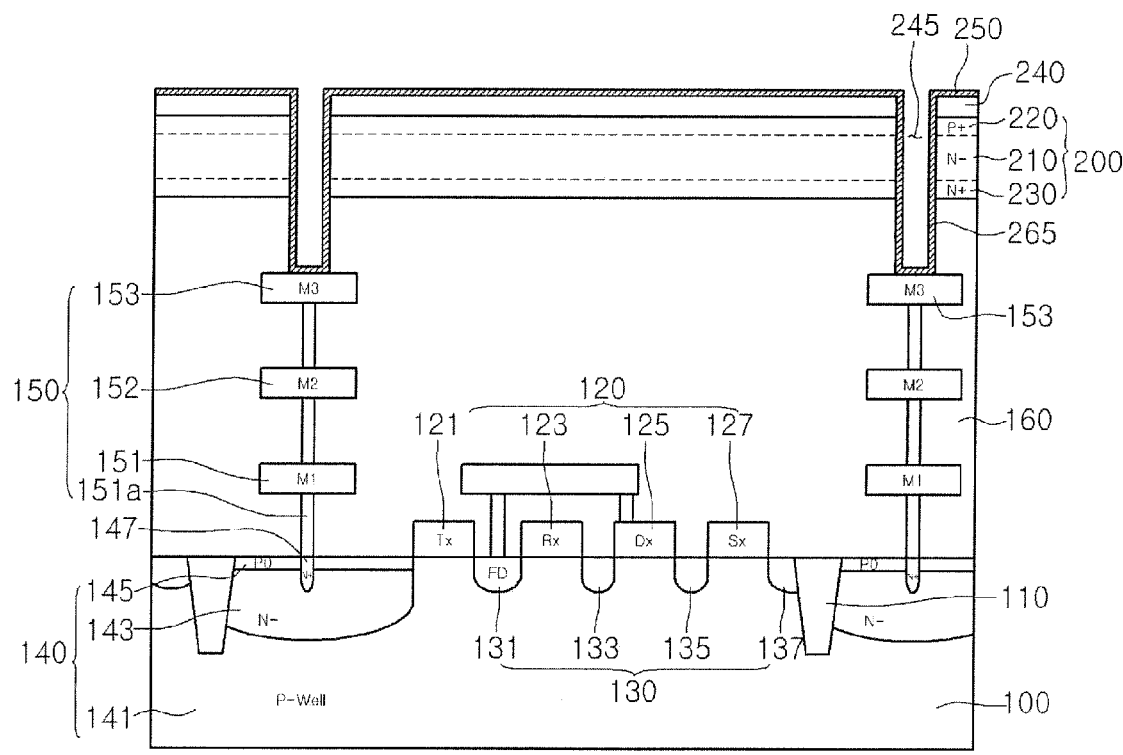

Referring to FIG. 4, an electrode layer 250 is formed on the image sensing unit 200 including the first hard mask 240 and the via hole 245. The electrode layer 250 may be formed along the surfaces of the via hole 245 and the first hard mask 240. The electrode layer 250 is formed thinly along the surface of the via hole 245, so that the via hole 245 can maintain its shape. The electrode layer 250 is formed to contact the image sensing unit 200 and the third metal 153 through the via hole 245, thereby connecting the image sensing unit 200 and the readout circuit 120 electrically.

The electrode layer 250 transfers electrons generated in the image sensing unit 200 through the metal interconnection 150 to the readout circuit 120. The electrode layer 250 may be formed of metal. For example, the electrode layer 250 may be formed of one of Ti, TiN, and Ti/TiN.

Meanwhile, the electrode layer 250 must be connected to only the metal interconnection 150 and the first impurity region 210 and/or the first ion implantation region 230 of the image sensing unit 200. The reason for this is that the image sensor may be electrically shorted if the electrode layer 250 is electrically connected to both of the first impurity region 210 and the second impurity region 220 of the image sensing unit 200. Thus, because the electrode layer 250 must be electrically disconnected from the second impurity region 220 of the image sensing unit 200, it is necessary to remove a partial region of the electrode layer 250 within the via hole 245.

Figure 5:
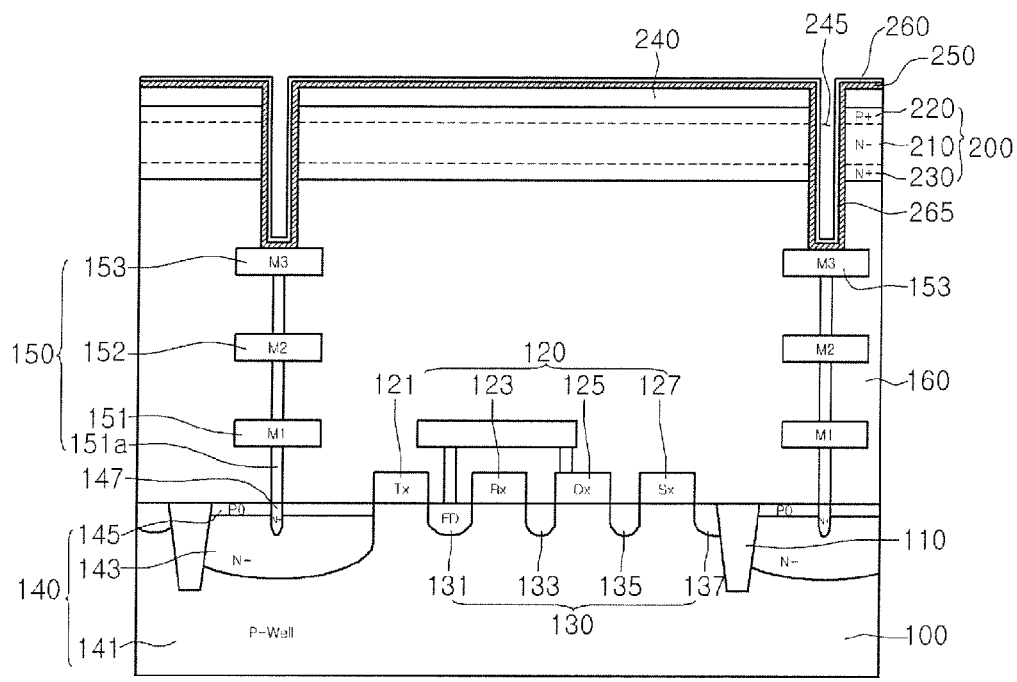

Referring to FIG. 5, a second hard mask layer 260 is formed on the image sensing unit 200 including the electrode layer 250. The second hard mask layer 260 is formed thinly along the surface of the electrode layer 250, so that the via hole 245 can maintain its shape.

In an embodiment, the second hard mask layer 260 may be formed of the same material as the first hard mask 240. For example, the second hard mask layer 260 may be formed of an oxide ($SiO_2$) or a nitride. Meanwhile, the second hard mask layer 260 may also be formed of various materials that can be etched with a particular selectivity (or inhibited from being etched) with respect to the electrode layer 250.

Figure 6:
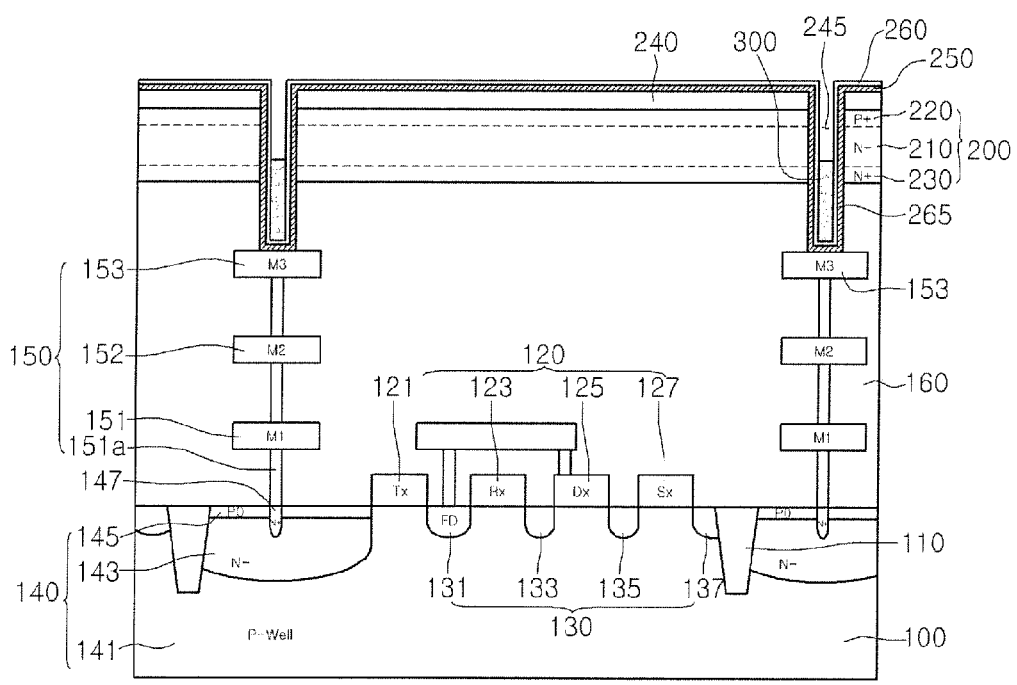

Referring to FIG. 6, a photoresist pattern 300 is formed in the via hole 245. The photoresist pattern 300 may be formed by coating a photoresist material on the image sensing unit 200 including the via hole 245 and performing an ashing process to leave the photoresist material only in a bottom region of the via hole 245. Specifically, the photoresist pattern 300 may be recessed such that it is left to the height (or lower than the height) of the first impurity region 210 in the via hole 245. Thus, the photoresist pattern 300 may be formed in the bottom region of the via hole 245 to expose the second hard mask layer 260 corresponding to the second impurity region 220.

Figure 7:
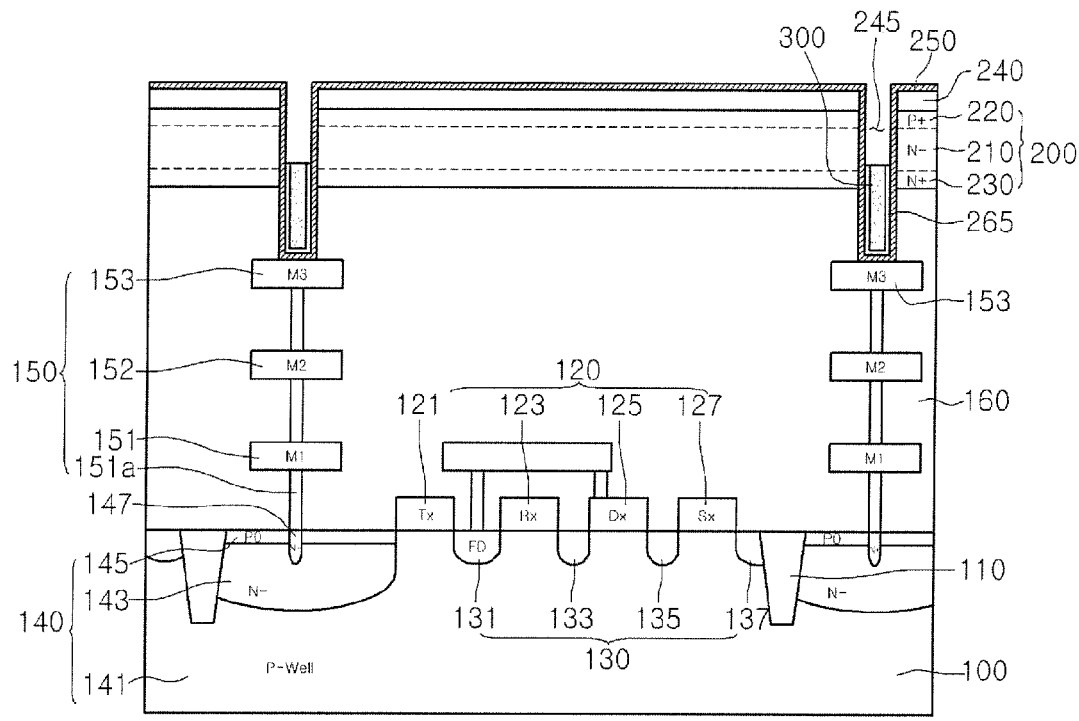

Referring to FIG. 7, a second hard mask 265 is formed in the via hole 245. The second hard mask 265 may be formed from the hard mask layer 260 by performing an etch process using the photoresist pattern 300 as an etch mask. For example, the second hard mask 265 may be formed by performing a dilute hydrofluoric acid (DHF) etch process to selectively remove only the second hard mask layer 260 formed of an oxide, thus removing only the second hard mask layer 260 corresponding to regions exposed by the photoresist pattern 300.

Accordingly, only the electrode layer 250, the photoresist pattern 300, and the second hard mask 265 are left in the via hole 245. Meanwhile, the electrode layer 250 of the remaining region, except the region covered by the second bard mask 265, is exposed.

The second hard mask 265 may have the same height as the photoresist pattern 300 because the second hard mask 265 is formed through an etch process using the photoresist pattern 300 as an etch mask. That is, the second hard mask 265 may be formed in the via hole 245 at most to the height of the first impurity region 210. Although not shown in the drawings, the second hard mask 265 may be formed in the via hole 245 only to the height of the first ion implantation region 230.

Figure 8:
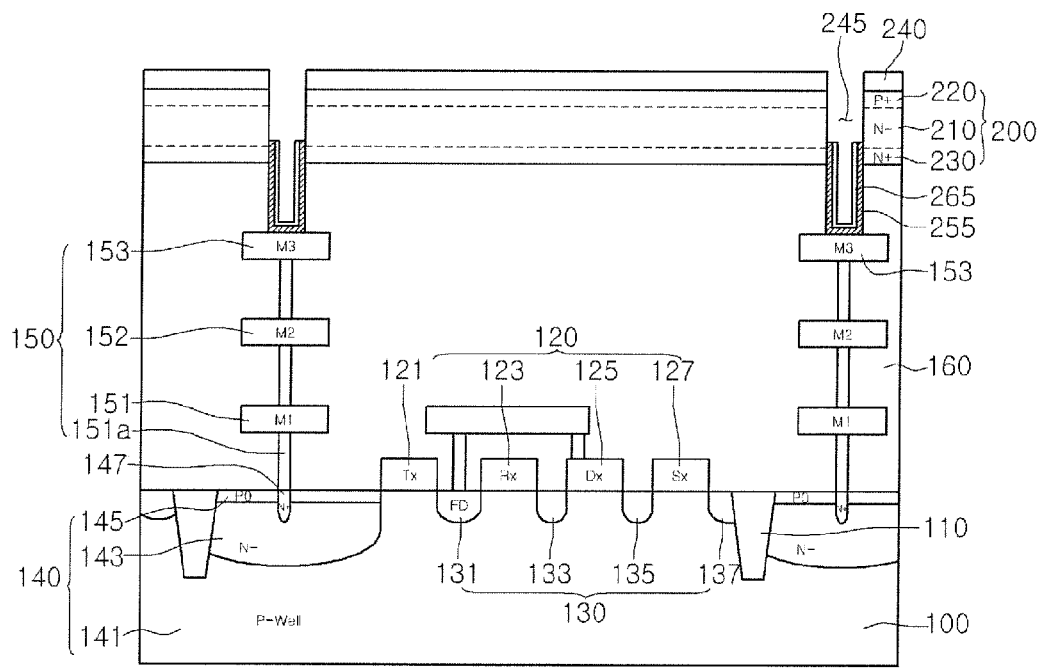

Referring to FIG. 8, the bottom electrode 255 may be formed by selectively removing the electrode layer 250 through an etch process using the second hard mask 265 as an etch mask.

For example, the bottom electrode 255 can be formed by using an $H_2SO_4$ chemical to remove the electrode layer 250 of the top of the via hole 245 exposed by the second hard mask 265. Because the metal and the photoresist may be selectively removed by the $H_2SO_4$ chemical, the photoresist pattern 300 may be removed simultaneously with the etching of the electrode layer 250.

Because the bottom electrode 255 can be formed using the second hard mask 265 of dielectric material as an etch mask, the $H_2SO_4$ chemical may be used to remove the electrode layer 250. Therefore, because the photoresist may be removed simultaneously, a process for removing the photoresist pattern 300 may be omitted.

Through the above etching processes, the second hard mask 265 and the bottom electrode 255 are formed in the via hole 245. Because the bottom electrode 255 and the second hard mask 265 are formed to the same height, a portion of the first impurity region 210 and the second impurity region 220 in the via hole 245 are exposed. Thus, the bottom electrode 255 is electrically connected to the first impurity region 210 and is electrically disconnected from the second impurity region 220.

Figure 9:
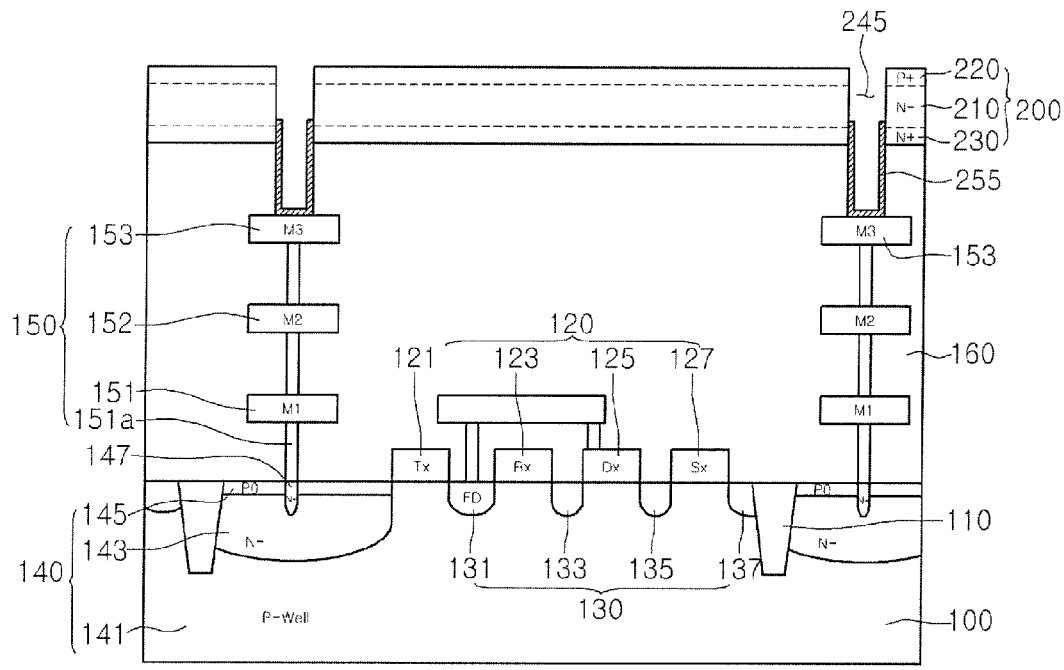

Referring to FIG. 9, the second hard mask 265 in the via hole 245 and the first hard mask 240 on the image sensing unit 200 are removed to leave only the bottom electrode 255 in the via hole 245. When the first hard mask 240 and the second hard mask 265 are both formed of an oxide, they may be removed simultaneously by etch chemicals such as DHF.

The bottom electrode 255 is formed extending from the third metal 153 to the first impurity region 210 to electrically connect the readout circuit 120 and the first impurity region 210. Consequently, the metal electrode is connected to the first impurity region 210 and/or the first ion implantation region 230 of the image sensing unit 200, thereby transferring the electrons generated in the image sensing unit 200 to the readout circuit 120.

As described above, a photoresist recess process with good uniformity is used to form the bottom electrode 255 in the via hole 245, thereby improving the quality of the image sensor. That is, through the photoresist recess process, the bottom electrode 255 is electrically connected to only the first impurity region 210 (and/or the first ion implantation region 230) of the image sensing unit 200 and is electrically disconnected from the second impurity region 220, thus making it possible to implement normal signal output.

Referring to FIG. 10, a device isolation region 280 is formed in the image sensing unit 200 to isolate the image sensing unit 200 on a unit pixel basis. The device isolation region 280 may be formed using a shallow trench isolation (STI) process or an ion implantation process. For example, if an STI process is used to form the device isolation region 280, the device isolation region 280 may be formed by forming a trench, which pierces the image sensing unit 200 corresponding to a region between the metal interconnections 150 formed for unit pixels, and gap-filling the trench with a dielectric material. At this point, the via hole 245 on the bottom electrode 255 may also be filled with the dielectric material.

Although not shown in the drawings, a top electrode for applying a ground voltage may be formed on the image sensing unit 200. For example, the top electrode may be a transparent electrode or a metal electrode. Also, a color filter and a microlens may be formed on the image sensing unit 200 on a unit pixel basis.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A method for fabricating an image sensor, comprising:
    forming a readout circuit in a semiconductor substrate;
    forming an interconnection connected to the readout circuit on the semiconductor substrate;
    forming a dielectric interlayer on the semiconductor substrate, covering the interconnection;
    forming an image sensing unit including a stack of a first impurity region and a second impurity region on the dielectric interlayer;
    forming a via hole piercing the image sensing unit and the dielectric interlayer to expose the interconnection; and
    forming a bottom electrode in the via hole to electrically connect the interconnection and the first impurity region of the image sensing unit,
    wherein the forming of the bottom electrode comprises:
    forming an electrode layer along surfaces of the via hole and the image sensing unit;
    forming a hard mask layer along the surface of the electrode layer;
    forming a photoresist pattern on the hard mask layer to fill only a portion of the via hole;
    forming a hard mask by selectively etching the hard mask layer through an etch process using the photoresist pattern as an etch mask;
    exposing the second impurity region by selectively etching the electrode layer through an etch process using the hard mask as an etch mask; and
    removing the hard mask.

2. The method according to claim 1, wherein the image sensing unit further comprises a first ion implantation region, wherein the first ion implantation region is disposed on the dielectric layer under the first impurity region of the image sensing unit, and
    wherein the bottom electrode connects the first ion implantation region to the interconnection.

3. The method according to claim 1, wherein the hard mask is formed of an oxide or a nitride.

4. The method according to claim 1, wherein the photoresist pattern is removed simultaneously with the etching of the electrode layer.

5. The method according to claim 1, wherein the electrode layer is etched using $H_2SO_4$.

6. The method according to claim 1, wherein forming the via hole comprises:
    forming a first hard mask on the image sensing unit, the first hard mask exposing portions of the image sensing unit corresponding to the interconnection; and
    etching the image sensing unit and the dielectric layer using the first hard mask as an etch mask.

7. The method according to claim 6, wherein the first hard mask is removed during the removing of the hard mask used for exposing the second impurity region.

8. The method according to claim 7, wherein the first hard mask and the hard mask used for exposing the second impurity region are both formed of an oxide.

9. The method according to claim 6, wherein the first hard mask is formed of an oxide or a nitride.

10. The method according to claim 1, wherein the bottom electrode is formed of one of Ti, TiN, and Ti/TiN.

* * * * *